(12) United States Patent
Kimura et al.

(10) Patent No.: US 10,400,085 B2
(45) Date of Patent: Sep. 3, 2019

(54) ELECTRON BEAM CURABLE RESIN COMPOSITION, REFLECTOR RESIN FRAME, REFLECTOR, SEMICONDUCTOR LIGHT-EMITTING DEVICE, AND MOLDED ARTICLE PRODUCTION METHOD

(71) Applicant: Dai Nippon Printing Co., Ltd., Tokyo (JP)

(72) Inventors: Aki Kimura, Tsukuba (JP); Katsuya Sakayori, Fujimino (JP); Toshiyuki Sakai, Tsukubamirai (JP); Toshimasa Takarabe, Tokyo (JP); Kei Amagai, Tsukuba (JP); Kazunori Oda, Kawaguchi (JP); Megumi Ooishi, Okayama (JP); Takeshi Sekiguchi, Saitama (JP); Kenzaburou Kawai, Matsudo (JP); Kurumi Hashimoto, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/764,828

(22) PCT Filed: Jan. 30, 2014

(86) PCT No.: PCT/JP2014/052171
§ 371 (c)(1),
(2) Date: Jul. 30, 2015

(87) PCT Pub. No.: WO2014/119692
PCT Pub. Date: Aug. 7, 2014

(65) Prior Publication Data
US 2015/0361246 A1      Dec. 17, 2015

(30) Foreign Application Priority Data

Jan. 31, 2013   (JP) .................. 2013-017825

(51) Int. Cl.
*C08K 5/12*       (2006.01)
*C08F 2/54*       (2006.01)
(Continued)

(52) U.S. Cl.
CPC .................. *C08K 5/12* (2013.01); *C08F 2/54* (2013.01); *C08K 3/22* (2013.01); *C08K 5/34924* (2013.01);
(Continued)

(58) Field of Classification Search
CPC ....... C08L 23/02; C08K 7/14; C08K 5/34924; C08K 3/36; C08K 5/12; C08K 5/34926; C08K 3/22; H01L 33/60; C01F 2/54
See application file for complete search history.

(56) References Cited

U.S. PATENT DOCUMENTS 4,100,224 A * 7/1978 Hess ....................... C08L 67/06
                                                                 525/166
4,638,019 A * 1/1987 Von Gentzkow ..... C08F 255/02
                                                                 522/104
(Continued)

FOREIGN PATENT DOCUMENTS

CN       102741235 A    10/2012
JP       59059712 A     4/1984
(Continued)

OTHER PUBLICATIONS

International Search Report dated Apr. 22, 2014; PCT/JP2014/052171.
(Continued)

*Primary Examiner* — Dale E Page
*Assistant Examiner* — Quovaunda Jefferson
(74) *Attorney, Agent, or Firm* — Oliff PLC

(57) ABSTRACT

Provided are an electron beam curable resin composition including an olefin resin, a crosslinking agent, and a white
(Continued)

pigment, in which the crosslinking agent has a saturated or unsaturated ring structure, at least one atom among atoms forming at least one ring is bonded to any allylic substituent of an allyl group, a methallyl group, an allyl group through a linking group, and a methallyl group through a linking group, and the white pigment is blended in an amount of more than 200 parts by mass and 500 parts by mass or less with respect to 100 parts by mass of olefin resin, a reflector resin frame using the resin composition, a reflector, a semiconductor light-emitting device, and a molding method using the resin composition.

19 Claims, 1 Drawing Sheet

(51) Int. Cl.
H01L 33/60 (2010.01)
C08K 5/3492 (2006.01)
C08K 3/22 (2006.01)
C08K 7/14 (2006.01)

(52) U.S. Cl.
CPC ............ *C08K 5/34926* (2013.01); *C08K 7/14* (2013.01); *H01L 33/60* (2013.01); C08K 2003/2241 (2013.01); H01L 2224/48091 (2013.01); H01L 2224/48247 (2013.01); H01L 2924/181 (2013.01)

(56) References Cited

U.S. PATENT DOCUMENTS

| | | | | |
|---|---|---|---|---|
| 5,206,092 A | * | 4/1993 | Araki | C08J 7/18 428/447 |
| 2002/0017734 A1 | * | 2/2002 | Sugihara | B29C 44/3446 264/51 |
| 2003/0170400 A1 | * | 9/2003 | Laver | C08F 283/01 427/458 |
| 2006/0052558 A1 | * | 3/2006 | Morikawa | C08F 214/18 526/247 |
| 2006/0116466 A1 | * | 6/2006 | Kadowaki | B82Y 30/00 524/495 |
| 2007/0267059 A1 | * | 11/2007 | Nishijima | C08L 23/02 136/256 |
| 2009/0181189 A1 | * | 7/2009 | Tsubaki | B41M 5/345 428/32.75 |
| 2013/0023629 A1 | | 1/2013 | Yamaura et al. | |

FOREIGN PATENT DOCUMENTS

| | | |
|---|---|---|
| JP | 05-024109 A | 2/1993 |
| JP | 11-001631 A | 1/1999 |
| JP | 2011-190431 A | 9/2011 |
| JP | 2011-195709 A | 10/2011 |
| JP | 2012-094845 A | 5/2012 |
| JP | 2012-180432 A | 9/2012 |
| JP | 5060707 B2 | 10/2012 |
| JP | 2013-166926 A | 8/2013 |
| WO | 2011/027562 A1 | 3/2011 |
| WO | 2011/096477 A1 | 8/2011 |

OTHER PUBLICATIONS

Yuzhong Wang et al. "Introduction to Polymer Science", Science Press, Dec. 2010; p. 222, verse 14.2.1
Zhihua Wu et al; "Technology of Polymer Processing", Sichuan University Press, Sep. 2010, p. 73, 2nd paragraph.
Chinese Office Action dated Jul. 4, 2016; Appln. No. 201480007017.8.

* cited by examiner

ELECTRON BEAM CURABLE RESIN COMPOSITION, REFLECTOR RESIN FRAME, REFLECTOR, SEMICONDUCTOR LIGHT-EMITTING DEVICE, AND MOLDED ARTICLE PRODUCTION METHOD

TECHNICAL FIELD

The present invention relates to an electron beam curable resin composition, a reflector resin frame, a reflector, a semiconductor light-emitting device, and a molded article production method.

BACKGROUND ART

Since an LED element as a semiconductor light-emitting device has a small size, a long life, and excellent power saving performance, LED elements have been widely used as a light source of a display lamp, or the like. In recent years, an LED element having higher brightness has been produced at a relatively low cost, and thus, the use of LED elements as a light source in place of a fluorescent lamp and a light bulb has been considered. When LED elements are used as such a light source, a method has been frequently used in which plural LED elements are arranged on a surface mounting type LED package, that is, a metal substrate (LED mounting substrate) of aluminum or the like, and a reflector (a reflecting body) which reflects light in a predetermined direction is arranged in the vicinity of each LED element to obtain high illuminance.

However, since LED elements give off heat generation during light-emitting, in an LED light device adopting such a method, the reflector is deteriorated due to a rising temperature during light-emitting of the LED elements, and the reflectivity is degraded and brightness is degraded. Thus, the lifetime of the LED element is shortened. Accordingly, heat resistance is required for the reflector.

In addition, it is also required that even when the temperature rises during light-emitting of the LED elements, the reflector is not deteriorated.

Further, the material for forming a reflector is required to have a property of being easily processed into a reflector to increase productivity, that is, high formability, with the above-described properties.

As a reflector resin composition, for example, in PTL 1, there is proposed a light reflecting thermosetting resin composition containing (A) an epoxy resin, (B) a curing agent, (C) a curing catalyst, (D) an inorganic filler, (E) a white pigment, and (F) a coupling agent.

In PTL 2, there is proposed a polyamide composition containing polyamide having cyclohexanedicarboxylic acid units including 50 mol % to 100 mol % of 1,4-cyclohexanedicarboxylic acid units and diamine units including 50 mol % to 100 mol % of aliphatic diamine units having 4 to 18 carbon atoms.

In PTL 3, there is proposed a resin composition made of a fluororesin (A) having carbon-hydrogen bonding and titanium oxide (B).

CITATION LIST

Patent Literature

[PTL 1] Japanese Patent No. 5060707
[PTL 2] WO 2011/027562
[PTL 3] JP-A-2011-195709

SUMMARY OF INVENTION

Technical Problem

However, since the epoxy resin used in PTL 1 is a thermosetting resin, the resin has high fluidity before curing and enables high loading of an inorganic component. However, from the viewpoint of molding time and molding failure (particularly, protrusions (burrs) formed when a material is processed), mass productivity is deteriorated and thus the epoxy resin is not put in practical use.

The resin compositions used in PTLs 2 and 3 are thermoplastic resins and have good mass productivity. However, since molding is performed at a low temperature from the viewpoint of preventing deterioration of the resin, the resin has a lowered fluidity and high loading of an inorganic component is not possible. As a result, the amount of the resin component is relatively increased and a problem arises in that long-term heat resistance is deteriorated.

From the above, an object of the present invention is to provide an electron beam curable resin composition capable of having excellent formability and exhibiting excellent heat resistance when being formed into a molded article such as a reflector, a reflector resin frame using the resin composition, a reflector, a semiconductor light-emitting device, and a molding method using the resin composition.

Solution to Problem

As the result of intensive studies to achieve the above object, the present inventor has found that the object can be achieved by the following inventions. That is, the present invention is as follows.

[1] An electron beam curable resin composition including: an olefin resin and a crosslinking agent and a white pigment, wherein the crosslinking agent has a saturated or unsaturated ring structure, at least one atom among atoms forming at least one ring is bonded to any allylic substituent of an allyl group, a methallyl group, an allyl group through a linking group, and a methallyl group through a linking group, and the white pigment is contained in an amount of more than 200 parts by mass and 500 parts by mass or less with respect to 100 parts by mass of olefin resin.

[2] The electron beam curable resin composition described in [1], wherein at least two atoms among the atoms forming one ring of the crosslinking agent are each independently bonded to the allylic substituent.

[3] The electron beam curable resin composition described in [2], wherein the ring of the crosslinking agent is a six-membered ring, at least two atoms among the atoms forming the ring are each independently bonded to the allylic substituent, and another allylic substituent is bonded to an atom in a meta position with respect to an atom bonded with one allylic substituent.

[4] The electron beam curable resin composition described in any one of [1] to [3], wherein the crosslinking agent is expressed by the following Formula (1).

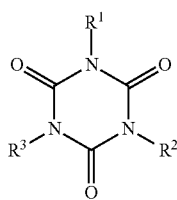

(1)

In the Formula (1), $R^1$ to $R^3$ are each independently any allylic substituent of an allyl group, a methallyl group, an allyl group through ester bonding, and a methallyl group through ester bonding.

[5] The electron beam curable resin composition described in any one of [1] to [3], wherein the crosslinking agent is expressed by the following Formula (2).

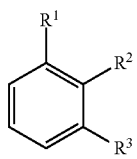

(2)

In the Formula (2), $R^1$ to $R^3$ are each independently any allylic substituent of an allyl group, a methallyl group, an allyl group through ester bonding, and a methallyl group through ester bonding.

[6] The electron beam curable resin composition described in any one of [1] to [5], further includes inorganic particles other than the white pigment.

[7] The electron beam curable resin composition described in [6], wherein the inorganic particles other than the white pigment are silica particles or glass fibers.

[8] The electron beam curable resin composition described in any one of [1] to [7], wherein a dispersant or a resin modifier is blended.

[9] A reflector resin frame including: a cured product of the electron beam curable resin composition described in any one of [1] to [8].

[10] The reflector resin frame described in [9], wherein a thickness is 0.1 mm to 3.0 mm.

[11] Reflector including: a cured product of the electron beam curable resin composition described in any one of claims [1] to [8].

[12] A semiconductor light-emitting device including: an optical semiconductor element and a reflector which is provided in the vicinity of the optical semiconductor element and reflects light from the optical semiconductor element in a predetermined direction, wherein the optical semiconductor element and the reflector are provided on a substrate, and at least a part of the light reflecting surface of the reflector is made of a cured product of the electron beam curable resin composition described in any one of [1] to [8].

[13] A molded article production method including; an injection molding process of performing injection molding on the electron beam curable resin composition described in any one of [1] to [8] at an injection temperature of 200° C. to 400° C. and at a mold temperature of 20° C. to 150° C.; and an electron beam irradiation process of performing electron beam irradiation treatment before and after the injection molding process.

Advantageous Effects of Invention

According to the present invention, it is possible to provide an electron beam curable resin composition capable of having excellent formability and exhibiting excellent heat resistance when being formed into a molded article such as a reflector, a reflector resin frame using the resin composition, a reflector, a semiconductor light-emitting device, and a molding method using the resin composition.

DESCRIPTION OF EMBODIMENTS

[1. Electron Beam Curable Resin Composition]

Figure 1:
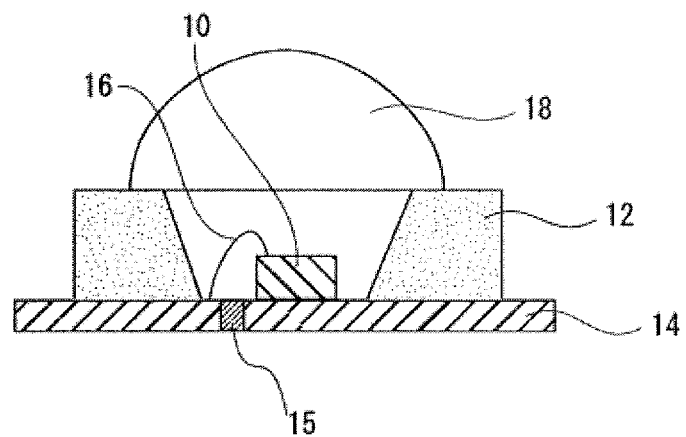
FIG. 1 is a schematic cross-sectional view showing an example of a semiconductor light-emitting device of the present invention.

An electron beam curable resin composition of the present invention includes an olefin resin, a specific crosslinking agent, and a white pigment.

Examples of the olefin resin include a resin obtained by ring-opening metathesis polymerization of norbornene derivatives (norbornene polymer) or a hydrogen-added product thereof, polyethylene, polypropylene, and polymethylpentene. Among these examples, polymethylpentene is preferable.

Among the olefin resins, since the refractive index of polymethylpentene is 1.46, and this value is very close to the refractive index of a silica particle, it is possible to suppress inhibition of optical properties such as transmittance and reflectivity even when polymethylpentene is mixed. Considering this point, for example, the resin composition is suitably used as a reflector of a semiconductor light-emitting device.

However, heat resistance was not sufficient in a reflow process in some cases. To solve this problem, in the present invention, a resin composition exhibiting a sufficient heat resistance even in a reflow process can be obtained by containing a specific crosslinking agent in polymethylpentene and irradiating the resin with an electron beam. Accordingly, even when the resin composition is formed into a reflector, it is possible to prevent the reflector from being deformed by melting of the resin.

Polymethylpentene has properties of having a high melting point of 232° C., not being decomposed even at a processing temperature of about 280° C., and having a decomposition temperature close to 300° C. On the other hand, since organic peroxides and photopolymerization initiators having such properties are not generally present, crosslinking by the organic peroxides and crosslinking by ultraviolet light are not possible.

In addition, even when polymethylpentene is irradiated with an electron beam (for example, absorbed radiation dose: 200 kGy), molecular chains are cut simultaneously with the crosslinking, and thus, effective crosslinking does not occur only by the resin. However, since an effective crosslinking reaction occurs through electron beam irradiation by containing the crosslinking agent according to the present invention, it is possible to prevent deformation by melting of the resin even in a reflow process.

Such a crosslinking agent has a saturated or unsaturated ring structure, and at least one atom among atoms forming at least one ring is bonded to any allylic substituent of an allyl group, a methallyl group, an allyl group through a linking group, and a methallyl group through a linking group. By containing the crosslinking agent having such a structure, satisfactory electron beam curability is exhibited and thus, a resin composition having excellent heat resistance can be formed.

Examples of the saturated or unsaturated ring structure include a cyclo ring, a hetero ring, and an aromatic ring. The number of atoms forming the ring structure is preferably 3 to 12, more preferably 5 to 8, and a 6-membered ring is still more preferable.

In addition, the molecular weight of the crosslinking agent according to the present invention is preferably 1,000 or less, more preferably 500 or less, and still more preferably 300 or less. When the molecular weight is 1,000 or less, it is possible to prevent the dispersibility in the resin composition from being deteriorated and thus, an effective crosslinking reaction by electron beam irradiation can occur.

Further, the number of the ring structures is preferably 1 to 3, more preferably 1 or 2, and still more preferably 1.

The boiling point of the crosslinking agent is preferably equal to or lower than a boiling point of an olefin resin to be used and for example, is preferably 200° C. or lower.

When the above-described crosslinking agent is used, fluidity becomes excellent at the time of processing and thus the processing temperature of the thermoplastic resin is lowered. Then, a thermal load can be reduced, friction at the time of processing can be reduced, or the filling amount of an inorganic component can be increased.

Here, examples of the linking group of the crosslinking agent according to the present invention include ester bonding, ether bonding, an alkylene group, and a (hetero)allylene group. An atom that is not bonded to the allylic substituent among the atoms forming the ring is bonded with hydrogen, oxygen, nitrogen, and the like, or is bonded with various substituents.

In the crosslinking agent according to the present invention, it is preferable that at least two atoms among the atoms forming one ring of the crosslinking agent are each independently bonded to the allylic substituent. When the ring structure is a 6-membered ring, it is preferable that at least two atoms among the atoms forming the ring are each independently bonded to the allylic substituent, and with respect to an atom to which one the allylic substituent is bonded, another allylic substituent is bonded to an atom in a meta position.

Further, it is preferable that the crosslinking agent according to the present invention be expressed by the following Formula (1) or (2).

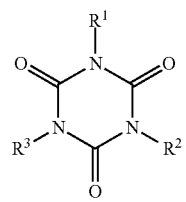
(1)

In the Formula (1), $R^1$ to $R^3$ are each independently any allylic substituent of an allyl group, a methallyl group, an allyl group through ester bonding, and a methallyl group through ester bonding.

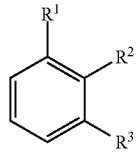
(2)

In the Formula (2), $R^1$ to $R^3$ are each independently any allylic substituent of an allyl group, a methallyl group, an allyl group through ester bonding, and a methallyl group through ester bonding.

Examples of the crosslinking agent expressed by the above Formula (1) include triallyl isocyanurate, methyl diallyl isocyanurate, diallyl monoglycidyl isocyanuric acid, monoallyl diglycidyl isocyanurate, and trimethallyl isocyanurate.

Examples of the crosslinking agent expressed by the above Formula (2) include orthophthalic acid diallyl ester, and isophthalic acid diallyl ester.

The amount of the crosslinking agent blended according to the present invention is preferably more than 2 parts by mass to 40 parts by mass or less, more preferably 10 parts by mass to 40 parts by mass, further preferably 15 parts by mass to 30 parts by mass, particularly preferably 15 parts by mass to 30 parts by mass, and very preferably 16 parts by mass to 20 parts by mass with respect to 100 parts by mass of olefin resin. When the crosslinking agent is blended in an amount of more than 2 parts by mass to 40 parts by mass, crosslinking can proceed effectively without bleed-out.

As the polymethylpentene resin, a homopolymer of 4-methylpentene-1 is preferable. However, the polymethylpentene resin may be a copolymer of 4-methylpentene-1 and other α-olefin, for example, α-olefin having 2 to 20 carbon atoms such as ethylene, propylene, 1-butene, 1-pentene, 1-hexene, 1-octene, 1-decene, 1-dodecene, 1-tetradecene, 1-octadecene, 1-eicocene, 3-methyl-1-butene, or 3-methyl-1-pentene, or may be a copolymer mainly including 4-methylpentene-1 containing 90 mol % or more of 4-methyl-1-pentene.

Regarding the molecular weight of the homopolymer of 4-methylpentene-1, the weight average molecular weight Mw in terms of polystyrene, measured by gel permeation chromatography, is 1,000 or more, and particularly preferably 5,000 or more.

A white pigment is included in the electron beam curable resin composition of the present invention. By including the white pigment, the resin composition can be used for a reflector or the like.

Further, it is preferable that the resin composition include inorganic particles other than the white pigment. Typically, the inorganic particles other than the white pigment can be blended with thermoplastic resin compositions and thermosetting resin compositions such as epoxy resin, acryl resin, and silicone resin, and the resultants can be used singly or in a mixture. The shape and particle size of the inorganic particles are not particularly limited. For example, particles having shapes such as a particulate shape, a fibrous shape, a fibrous shape having a modified cross-section, a shape having a large difference in unevenness, a flaky shape having a thin thickness can be used.

Specifically, silica particles, glass fibers, and the like can be used. Such electron beam curable resin compositions are particularly suitably used for a reflector.

As the white pigment according to the present invention, titanium oxide, zinc sulfide, zinc oxide, barium sulfide, potassium titanate, and the like can be used singly or in a mixture. Among them, titanium oxide is preferable.

The content of the white pigment is preferably more than 200 parts by mass and 500 parts by mass or less, more preferably 300 parts by mass to 480 parts by mass, and still more preferably 350 parts by mass to 450 parts by mass, with respect to 100 parts by mass of olefin resin. When the content of the white pigment is 200 parts by mass or less and more than 500 parts by mass, product performance (for example, light reflectivity, strength, and molding warpage of a reflector) is not sufficient or a large amount of the inorganic component cannot be processed. Even when a large amount of the inorganic component can be processed, the molding state is poor and the resin composition is dried. Thus, product performance (for example, light reflectivity of reflector) is deteriorated.

In consideration of formability, and from the viewpoint of obtaining high reflectivity, the average particle size of the white pigment is preferably 0.10 µm to 0.50 µm, more preferably 0.10 µm to 0.40 µm, and still more preferably 0.21 µm to 0.25 µm in a primary particle size distribution. The average particle size can be obtained as an average mass value D50 in particle size distribution measurement by a laser beam diffraction method.

The inorganic particles according to the present invention can be blended with thermoplastic resin compositions and thermosetting resin compositions such as epoxy resin, acryl resin, and silicone resin, and the resultants can be used singly or in a mixture.

The content of the inorganic particles is preferably 10 parts by mass to 300 parts by mass, more preferably 30 parts by mass to 200 parts by mass, and still more preferably 50 parts by mass to 120 parts by mass with respect to 100 parts by mass of olefin resin.

The electron beam curable resin composition according to the present invention can be prepared by mixing the aforementioned olefin resin, crosslinking agent, white pigment, and as required, inorganic particles selected from at least one of silica particles, glass fibers, and the like, at an aforementioned predetermined ratio. As for the mixing method, known means such as stirrers such as a two-roll mill, a three-roll mill, a homogenizer, and a planetary mixer, and melt kneading machines such as a Polylab system, and a Labo Plastomill can be applied. The aforementioned means may be used under any condition of room temperature, a cooled state, a heated state, normal pressure, a decompressed state, and a pressurized state.

As long as the effect of the present invention is not impaired, various additives can be added. For example, for the purpose of improving the properties of the resin composition, various additives such as whiskers, silicone powders, thermoplastic elastomers, organic synthetic rubbers, internal releasing agents such as fatty acid ester, glyceric acid esters, zinc stearate, and calcium stearate, antioxidants such as benzophenone-based antioxidants, salicylic acid-based antioxidants, cyanoacrylate-based antioxidants, isocyanurate-based antioxidants, anilide oxalate-based antioxidants, benzoate-based antioxidants, hindered amine-based antioxidants, benzotriazole-based antioxidants, and phenol-based antioxidants, and light stabilizers such as hindered amine-based light stabilizers and benzoate-based light stabilizers can be blended.

Further, a dispersant such as a silane coupling agent can be blended.

Examples of the silane coupling agent include silazanes such as hexamethyldisilazane; cyclic silazanes; alkylsilane compounds such as trimethylsilane, trimethylchlorosilane, dimethyldichlorosilane, methyltrichlorosilane, allyldimethylchlorosilane, trimethoxysilane, benzyldimethylchlorosilane, methyltrimethoxysilane, methyltriethoxysilane, isobutyltrimethoxysilane, dimethyldimethoxysilane, dimethyldiethoxysilane, trimethylmethoxysilane, hydroxypropyltrimethoxysilane, phenyltrimethoxysilane, n-butyltrimethoxysilane, n-hexadecyltrimethoxysilane, n-octadecyltrimethoxysilane, vinyltrimethoxysilane, vinyltriethoxysilane, γ-methacryloxypropyltrimethoxysilane and vinyltriacetoxysilane; and aminosilane compounds such as γ-aminopropyltriethoxysilane, γ-(2-aminoethyl) aminopropyltrimethoxysilane, γ-(2-aminoethyl)aminopropylmethyldimethoxysilane, N-phenyl-3-aminopropyltrimethoxysilane, N-(2-aminoethyl)-3-aminopropyltrimethoxysilane, N-β-(N-vinylbenzylaminoethyl)-γ-aminopropyltrimethoxysilane, and hexyltrimethoxysilane.

By using the electron beam curable resin composition of the present invention, various molded bodies can be molded and a thin molded article (for example, a reflector) having a thinner thickness can be prepared.

Such a molded article is preferably produced by a molding method of the present invention. That is, the molded article is preferably prepared by a molding method including an injection molding process of performing injection molding on the electron beam curable resin composition of the present invention at a cylinder temperature of 200° C. to 400° C. and a mold temperature of 20° C. to 150° C., and an electron beam irradiation process of performing electron beam irradiation treatment before and after the injection molding process.

As long as formability is not impaired, a crosslinking reaction by electron beam irradiation can be performed before the molding.

The acceleration voltage of the electron beam can be appropriately selected depending on a resin and a thickness of the layer to be used. For example, when a molded product has a thickness of about 1 mm, typically, an uncured resin layer is preferably cured at an acceleration voltage of about 250 kV to 3,000 kV. In the electron beam irradiation, the higher the acceleration voltage is, the higher the transmission capacity is. Thus, when a base material which is deteriorated by the electron beam is used as a base material, the acceleration voltage is selected so that the transmission depth of the electron beam becomes substantially equal to the thickness of the resin layer, and thus, excessive electron beam irradiation to the base material can be suppressed and deterioration of the base material by the excessive electron beam can be minimized. In addition, the absorbed radiation dose when the resin is irradiated with the electron beam is appropriately selected depending on the constitution of the resin composition. However, a dose in which the crosslinking density of the resin layer is saturated is preferable, and the dose is preferably 50 kGy to 600 kGy.

Further, the electron beam source is not particularly limited. For example, various electron beam accelerators such as a Cockcroft-Walton accelerator, a van de Graaff accelerator, a resonance transformer accelerator, an insulated core transformer accelerator, a linear accelerator, a dynamitron accelerator, and a high frequency accelerator can be used.

Such an electron beam curable resin composition of the present invention can be applied to various uses as a composite material obtained by applying and curing the resin composition on a base material or a cured product of the electron beam curable resin composition. For example, the resin composition can be applied to a heat resistant insulating film, a heat resistant release sheet, a heat resistant transparent base material, a light reflecting sheet of a solar cell, lighting such as an LED, and a light source reflector for a television.

[2. Reflector Resin Frame]

A reflector resin frame of the present invention is made of a cured product obtained by molding the aforementioned electron beam curable resin composition of the present invention. Specifically, the electron beam curable resin composition of the present invention is used as a pellet, and is formed into a resin frame having a desired shape by injection molding to produce a reflector resin frame of the present invention. The thickness of the reflector resin frame is preferably 0.1 mm to 3.0 mm, more preferably 0.1 mm to 1.0 mm, and still more preferably 0.1 mm to 0.8 mm.

Using the electron beam curable resin composition of the present invention, a thinner resin frame can be prepared compared to a resin frame obtained using, for example, a glass fiber. Specifically, a resin frame having a thickness of 0.1 mm to 3.0 mm can be produced. In addition, even when the thickness of the thus molded reflector resin frame of the present invention is reduced, warpage caused by including a filler such as a glass fiber does not occur, and thus, shape stability and handleability are excellent.

When an LED chip is mounted on the reflector resin frame of the present invention, and further the resin frame is sealed with a known sealing agent, and subjected to die bonding so as to have a desired shape, the resin frame can be used as a semiconductor light-emitting device. The reflector resin frame of the present invention acts as a reflector, and also functions as a frame for supporting the semiconductor light-emitting device.

[3. Reflector]

A reflector of the present invention is made of a cured product obtained by curing the aforementioned electron beam curable resin composition of the present invention.

The reflector may be used in combination with a semiconductor light-emitting device, which will be described later, or may be used in combination with a semiconductor light-emitting device (a substrate for mounting LED) made of another material.

The reflector of the present invention has an action of mainly reflecting light from an LED element of a semiconductor light-emitting device to a lens (a light-emitting portion). Details of the reflector are the same as the details of a reflector (a reflector 12 which will be described later) applied to the semiconductor light-emitting device of the present invention, and thus, the description thereof will be omitted.

Foaming caused by water is suppressed in the process of producing the reflector by containing the spherical fused silica particles in the reflector of the present invention, and thus, micropores small enough to cause a defect are not formed. Accordingly, in a product using the reflector (for example, a semiconductor light emitting element), a defect caused by the micropores does not easily occur and thus, the durability of the product can be improved.

As described above, in a semiconductor light emitting element in which a reflector is formed using the electron beam curable resin composition containing the spherical fused silica particles, micropores small enough to cause a defect in the reflector are not formed, and thus, a defect caused by the micropores does not easily occur. Therefore, the durability of the product can be improved.

[4. Semiconductor Light-Emitting Device]

As shown in FIG. 1, a semiconductor light-emitting device of the present invention includes an optical semiconductor element (for example, an LED element) 10, and a reflector 12 which is provided in the vicinity of the optical semiconductor element 10 and reflects light from the optical semiconductor element 10 to a predetermined direction, and the optical semiconductor element and the reflector are provided on a substrate 14. Then, at least a part of the light reflecting surface of the reflector 12 (the entire surface in FIG. 1) is made of a cured product of the aforementioned reflector composition of the present invention.

The optical semiconductor element 10 is a semiconductor chip (a light-emitting body) which emits radiated light (UV or blue light in the case of a white light LED, in general) and has a double-hetero structure in which an active layer formed of, for example, AlGaAs, AlGaInP, GaP or GaN, is interposed between n-type and p-type clad layers, and is shaped in the form of, for example, a hexahedron, each side having a length of about 0.5 mm. In the case in which the LED element is mounted by wire bonding, the LED element is connected to an electrode (a connecting terminal) (not shown) through a lead wire 16.

In the electrode to which the optical semiconductor element 10 and the lead wire 16 are connected, electrical insulation is held by an insulation portion 15 that is formed by resin or the like.

The shape of the reflector 12 depends on the shape of the end portion (junction portion) of a lens 18 and is typically cylindrical or annular such as square-shaped, circular-shaped, and ellipse-shaped. In the schematic cross-sectional view of FIG. 1, the reflector 12 is cylindrical (annular). The entire end surface of the reflector 12 is in contact with and fixed to the surface of the substrate 14.

The inner surface of the reflector 12 may be tapered so as to extend upward in order to increase the degree of directivity of light from the optical semiconductor element 10 (refer to FIG. 1).

Further, when the end portion of the reflector 12 close to the lens 18 is processed into a shape according to a shape of the lens 18, the reflector 12 can function as a lens holder.

Figure 2:
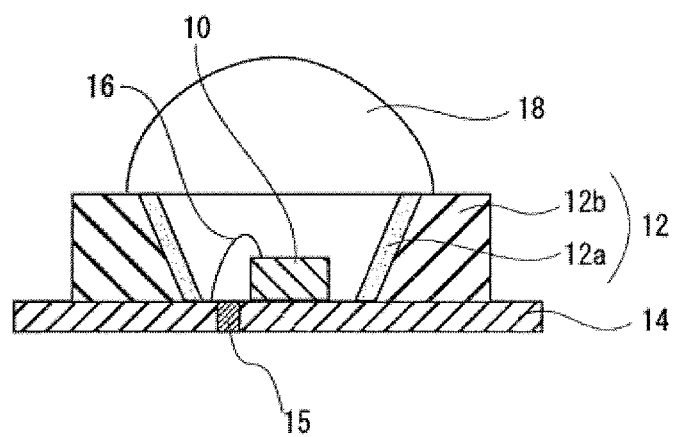
FIG. 2 is a schematic cross-sectional view showing an example of the semiconductor light-emitting device of the present invention.

As shown in FIG. 2, only the light reflecting surface of the reflector 12 may be used as a light reflecting layer 12a made of the electron beam curable resin composition of the present invention. In this case, the thickness of the light reflecting layer 12a is preferably 500 μm or less, and more preferably 300 μm or less, from the viewpoint of lowering heat resistance. A member 12b in which the light reflecting layer 12a is formed can be made of a known heat resistant resin.

As described above, the lens 18 is provided on the reflector 12. The lens 18 is typically made of a resin and can be formed into a variety of structures according to the purpose, the application and the like and may be colored.

A space portion which is formed by the substrate 14, the reflector 12, and the lens 18 may be a transparent sealing portion or a gap portion as required. The space portion is usually a transparent sealing portion filled with a material that provides translucency and insulation properties or the like. With the space portion, it is possible to prevent electrical failure caused when, in wire-bonding mounting, the lead wire 16 is disconnected, cut or short-circuited from the connection portion with the optical semiconductor element 10 and/or the connection portion with the electrode due to a force applied by direct contact to the lead wire 16 and a vibration, an impact and the like applied indirectly. Additionally, it is possible not only to protect the optical semiconductor element 10 from moisture, dust and the like but also to maintain reliability for a prolonged period.

Examples of the material (a transparent sealant composition) that provides translucency and insulation properties generally include a silicone resin, an epoxy silicone resin, an epoxy-based resin, an acryl-based resin, a polyimide-based resin, a polycarbonate resin and the like. Among them, a silicone resin is preferable in terms of heat resistance, weather resistance, low contraction and resistance to discoloration.

An example of a method for producing the semiconductor light-emitting device shown in FIG. 1 will be described below.

First, the reflective resin composition of the present invention is molded into the reflector 12 having a predetermined shape by transfer molding, compression molding, injection molding, or the like using a mold having a cavity space of a predetermined shape. Then, the optical semiconductor element 10, electrode, and lead wire 16 prepared separately are fixed to the substrate 14 by an adhesive or a joining member, and further, the reflector 12 is fixed to the substrate 14. Subsequently, a transparent sealant composition including a silicone resin and the like is injected into a recess portion formed by the substrate 14 and the reflector 12, cured by heating, and drying to form a transparent sealing portion. Then, the lens 18 is arranged on the transparent sealing portion to obtain the semiconductor light-emitting device shown in FIG. 1.

After the lens 18 is placed in a state where the transparent sealant composition is not cured, the composition may be cured. In addition, the insulation portion 15 is provided at any stage of each process.

EXAMPLES

Next, the present invention will be described in more detail using examples, but the present invention is not limited to these examples.

Materials used in Examples 1 to 17 and Comparative Examples 1 to 4 are as follows.

(A) Resin

Resin (1)

Polymethylpentene resin: TPX RT18 (manufactured by Mitsui Chemicals, Inc.)

Resin (2)

Polyphthalamide: Zytel HTN501 (manufactured by E.I. du Pont de Nemours and Co., Wilmington, Del.)

Resin (3)

Fluororesin: LM-730AP (manufactured by ASAHI GLASS CO., LTD)

Resin (4)

Polyethylene: ADMER SF731 (manufactured by Mitsui Chemicals, Inc.)

Resin (5)

Polypropylene: WF836DG3 (manufactured by Sumitomo Chemical Co., Ltd.)

Resin (6)

Cyclo olefin polymer (COP): Norbornene polymer ZEONOR 1600 (manufactured by manufactured by ZEON Corporation)

(B) Crosslinking Agent

The crosslinking agents are as follows. In addition, the structures of the following crosslinking agents are shown in the following Table 1 and chemical formula.

Crosslinking Agent 1

TAIC (trially isocyanurate), manufactured by Nippon Kasei Chemical Co., Ltd.

Crosslinking Agent 2

DAP monomer (orthophthalic acid diallyl ester), manufactured by DAISO CO., LTD.)

Crosslinking Agent 3

DAP 100 monomer (isophthalic acid diallyl ester), manufactured by DAISO CO., LTD.

Crosslinking Agent 4

MeDAIC (methyl diallyl isocyanurate), manufactured by SHIKOKU CHEMICALS CORPORATION Crosslinking Agent 5

DA-MGIC (diallyl monoglycidyl isocyanuric acid), manufactured by SHIKOKU CHEMICALS CORPORATION Crosslinking Agent 6

MA-DGIC (monoallyl diglycidyl isocyanurate), manufactured by SHIKOKU CHEMICALS CORPORATION Crosslinking Agent 7

TMAIC (trimethallyl isocyanurate), manufactured by Nippon Kasei Chemical Co., Ltd.

TABLE 1

| Crosslinking agent and co-crosslinking agent | (molecular weight) | Formula | Structure R$^1$ | R$^2$ | R$^3$ |
|---|---|---|---|---|---|
| Crosslinking agent 1 | TAIC (249.3) | Formula (1) | [allyl] | [allyl] | [allyl] |
| Crosslinking agent 2 | DAP monomer (246.3) | Formula (2) | [allyl ester] | [allyl ester] | — |
| Crosslinking agent 3 | DAP 100 monomer (246.3) | Formula (2) | [allyl ester] | — | [allyl ester] |
| Crosslinking agent 4 | MeDAIC (223.2) | Formula (1) | CH$_3$ | [allyl] | [allyl] |

TABLE 1-continued

| Crosslinking agent and co-crosslinking agent | (molecular weight) | Formula | Structure | | |
|---|---|---|---|---|---|
| | | | R¹ | R² | R³ |
| Crosslinking agent 5 | DA-MGIC (265.3) | Formula (1) | | | |
| Crosslinking agent 6 | MA-DGIC (281.3) | Formula (1) | | | |
| Crosslinking agent 7 | TMAIC (291.4) | Formula (1) | | | |

The formulae (1) and (2) showing the structures in Table 1 is as follows.

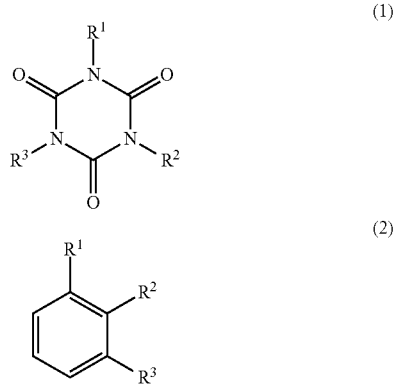

(C) White Pigment

Titanium oxide particles: PF-691 (manufactured by Ishihara Sangyo Kaisha, Ltd., rutile-type structure, average particle size: 0.21 μm)

(D) Inorganic Particle

Glass fiber: PF70E-001 (manufactured by Nitto Boseki Co., Ltd., fiber length: 70 μm)

(E) Additive

Silane coupling agent: KBM-3063 (manufactured by Shin-Etsu Chemical Co., Ltd.)

Releasing agent: SZ-2000 (manufactured by Sakai Chemical Industry Co., Ltd.)

Primary antioxidant: IRGANOX 1010 (manufactured by BASF Japan Ltd.)

Secondary antioxidant: PEP-36 (manufactured by ADEKA Corporation)

Examples 1 to 17, and Comparative Examples 1 to 4

Various materials were blended, kneaded, and pelletized to obtain resin compositions as shown in Tables 2-1 to 2-5. The resin compositions were pelletized in the following manner.

(Evaluation 1)

Pelletization

Here, each resin composition was pelletized by blending various materials using an extruder (MAX30: die diameter: 3.0 m, manufactured by Nippon Placon Co., Ltd.) and a pelletizer (MPETC1, manufactured by Toyo Seiki Seisaku-sho, Ltd.). The injection molding conditions were set such that the screw rotation speed was 200 rpm, the cylinder temperature was 270° C., and the discharge amount was 20 kg/hour. Thereby, a resin composition (pellet) having a pellet length of 3.2 mm was obtained.

(Evaluation 2)

Melt Flow Rate (MFR) Measurement

The MFR of each resin composition was measured according to a method described in MFR of thermoplastics defined in JIS K 7210: 1999. Specifically, the test was performed at a test temperature of 280° C. for 60 seconds under a test load of 2.16 kg. As a measurement apparatus, a melt flow tester manufactured by CEAST was used.

(Evaluation 3)

Formability

The obtained pellets were molded into a resin composition (thickness: 700 μm, external dimension: 35 mm×35 mm, and opening potion of 2.9 mm×2.9 mm) using an injection molding machine Sodick TR40ER Sodick (pre-plasticizing type) to form a reflector resin frame on a silver plated film (thickness: 250 μm). The injection molding condition was set such that the cylinder temperature was 270° C., the mold temperature was 80° C., the injection speed was 100 mm/sec, the packing pressure was 80 MPa, the packing time was 1 sec, and the cooling time was 8 sec.

The formability was evaluated by measuring burrs of the opening portion of the resin frame using a microscope. When the maximum width was less than 100 μm, it was determined that no burrs was formed and when the maximum width was 100 μm or more, it was determined that burrs were formed.

(Evaluation 4)

Reflectivity (Long-term Heat Resistance)

The molded samples were irradiated with an electron beam with an absorbed radiation dose of 400 kGy at an acceleration voltage of 800 kV. The light reflectivity was measured at a wavelength of 230 nm to 780 nm using a reflectivity measuring apparatus MCPD-9800 (manufactured by OTSUKA ELECTRONICS CO., LTD.) before and after these samples were left at 150° C. for 24 hours and 500 hours. In Tables 2-1 to 2-5, the results at a wavelength of 450 nm are shown.

TABLE 2-1

|  |  |  | Example 1 | Example 2 | Example 3 | Example 4 | Example 5 |
|---|---|---|---|---|---|---|---|
| Material blending | Resin | (1) | 100 | 100 | 100 | 100 | 100 |
|  |  | (2) |  |  |  |  |  |
|  |  | (3) |  |  |  |  |  |
|  | Crosslinking agent | 1 | 4 | 12 | 12 | 12 | 12 |
|  |  | 2 |  |  |  |  |  |
|  |  | 3 |  |  |  |  |  |
|  |  | 4 |  |  |  |  |  |
|  |  | 5 |  |  |  |  |  |
|  |  | 6 |  |  |  |  |  |
|  |  | 7 |  |  |  |  |  |
|  | White pigment |  | 220 | 350 | 300 | 350 | 450 |
|  | Inorganic particle | Glass fiber |  | 120 | 120 | 120 | 120 |
|  | Additive | Silane coupling agent | 1 | 5 | 5 | 5 | 5 |
|  |  | Releasing agent | 0.5 | 0.5 | 0.5 | 0.5 | 0.5 |
|  |  | Primary antioxidant | 1 | 5 | 5 | 5 | 5 |
|  |  | Secondary antioxidant | 0.5 | 0.5 | 0.5 | 0.5 | 0.5 |
| Evaluation result |  | Pelletization | Possible | Possible | Possible | Possible | Possible |
|  |  | MFR | 8.3 | 8.7 | 8.7 | 8.3 | 9.7 |
|  | Formability | Time (s) | 10 | 10 | 10 | 10 | 10 |
|  |  | Burr formation | None | None | None | None | None |
|  | Reflectivity | Initial stage* | 98.0 | 93.5 | 93.6 | 93.8 | 93.6 |
|  |  | 200° C. for 35 hours | 75.6 | 79.9 | 78.8 | 79.8 | 80.6 |

*The "initial stage" means that before the sample is left at 150° C.

TABLE 2-2

|  |  |  | Example 6 | Example 7 | Example 8 | Example 9 | Example 10 |
|---|---|---|---|---|---|---|---|
| Material blending | Resin | (1) | 100 | 100 | 100 | 100 | 100 |
|  |  | (2) |  |  |  |  |  |
|  |  | (3) |  |  |  |  |  |
|  | Crosslinking agent | 1 | 12 | 2 | 40 |  |  |
|  |  | 2 |  |  |  | 12 |  |
|  |  | 3 |  |  |  |  | 12 |
|  |  | 4 |  |  |  |  |  |
|  |  | 5 |  |  |  |  |  |
|  |  | 6 |  |  |  |  |  |
|  |  | 7 |  |  |  |  |  |
|  | White pigment |  | 500 | 220 | 350 | 350 | 350 |
|  | Inorganic particle | Glass fiber | 120 | 120 | 120 | 120 | 120 |
|  | Additive | Silane coupling agent | 5 | 7 | 5 | 5 | 5 |
|  |  | Releasing agent | 0.5 | 0.5 | 0.5 | 0.5 | 0.5 |
|  |  | Primary antioxidant | 5 | 5 | 5 | 5 | 5 |
|  |  | Secondary antioxidant | 0.5 | 0.5 | 0.5 | 0.5 | 0.5 |
| Evaluation result |  | Pelletization | Possible | Possible | Possible | Possible | Possible |
|  |  | MFR | 7.7 | 3.4 | 27.7 | 10.9 | 11.1 |
|  | Formability | Time (s) | 10 | 10 | 10 | 10 | 10 |
|  |  | Burr formation | None | None | None | None | None |
|  | Reflectivity | Initial stage* | 96.8 | 92.8 | 96.0 | 92.9 | 93.9 |
|  |  | 200° C. for 35 hours | 84.8 | 77.1 | 81.2 | 75.6 | 79.9 |

TABLE 2-3

|  |  |  | Example 11 | Example 12 | Example 13 | Example 14 |
|---|---|---|---|---|---|---|
| Material blending | Resin | (1) | 100 | 100 | 100 | 100 |
|  |  | (2) |  |  |  |  |
|  |  | (3) |  |  |  |  |
|  | Crosslinking agent | 1 |  |  |  |  |
|  |  | 2 |  |  |  |  |
|  |  | 3 |  |  |  |  |
|  |  | 4 | 12 |  |  |  |
|  |  | 5 |  | 12 |  |  |

TABLE 2-3-continued

|  |  |  | Example 11 | Example 12 | Example 13 | Example 14 |
|---|---|---|---|---|---|---|
|  |  | 6 |  |  | 12 |  |
|  |  | 7 |  |  |  | 12 |
|  | White pigment |  | 350 | 350 | 350 | 350 |
|  | Inorganic particle | Glass fiber | 120 | 120 | 120 | 120 |
|  | Additive | Silane coupling agent | 5 | 5 | 5 | 5 |
|  |  | Releasing agent | 0.5 | 0.5 | 0.5 | 0.5 |
|  |  | Primary antioxidant | 5 | 5 | 5 | 5 |
|  |  | Secondary antioxidant | 0.5 | 0.5 | 0.5 | 0.5 |
| Evaluation result | Pelletization |  | Possible | Possible | Possible | Possible |
|  | MFR |  | 8.8 | 8.1 | 7.7 | 7.5 |
|  | Formability | Time (s) | 10 | 10 | 10 | 10 |
|  |  | Burr formation | None | None | None | None |
|  | Reflectivity | Initial stage* | 91.9 | 91.6 | 92.5 | 92.2 |
|  |  | 200° C. for 35 hours | 75.8 | 78.2 | 75.4 | 77.0 |

TABLE 2-4

|  |  |  | Comparative Example 11 | Comparative Example 12 | Comparative Example 13 | Comparative Example 14 |
|---|---|---|---|---|---|---|
| Material blending | Resin | (1) | 100 | 100 |  |  |
|  |  | (2) |  |  | 100 |  |
|  |  | (3) |  |  |  | 100 |
|  | Crosslinking agent | 1 | 20 | 20 |  |  |
|  |  | 2 |  |  |  |  |
|  |  | 3 |  |  |  |  |
|  |  | 4 |  |  |  |  |
|  |  | 5 |  |  |  |  |
|  |  | 6 |  |  |  |  |
|  |  | 7 |  |  |  |  |
|  | White pigment |  | 150 | 550 | 200 | 200 |
|  | Inorganic particle | Glass fiber | 120 | 120 | 120 | 120 |
|  | Additive | Silane coupling agent | 5 | 5 | 5 | 5 |
|  |  | Releasing agent | 0.5 | 0.5 | 0.5 | 0.5 |
|  |  | Primary antioxidant | 5 | 5 | 5 | 5 |
|  |  | Secondary antioxidant | 0.5 | 0.5 | 0.5 | 0.5 |
| Evaluation result | Pelletization |  | Possible | Not possible | Not possible | Not possible |
|  | MFR |  | 10.1 | — | — | — |
|  | Formability | Time (s) | 10 | — | — | — |
|  |  | Burr formation | None | — | — | — |
|  | Reflectivity | Initial stage* | 89.1 | — | — | — |
|  |  | 200° C. for 35 hours | 69.6 | — | — | — |

TABLE 2-5

|  |  |  | Example 15 | Example 16 | Example 17 |
|---|---|---|---|---|---|
| Material blending | Resin | (4) | 100 |  |  |
|  |  | (5) |  | 100 |  |
|  |  | (6) |  |  | 100 |
|  | Crosslinking agent | 1 | 12 | 12 | 12 |
|  |  | 2 |  |  |  |
|  |  | 3 |  |  |  |
|  |  | 4 |  |  |  |
|  |  | 5 |  |  |  |
|  |  | 6 |  |  |  |
|  |  | 7 |  |  |  |
|  | White pigment |  | 350 | 350 | 350 |
|  | Inorganic particle | Glass fiber | 120 | 120 | 120 |
|  | Additive | Silane coupling agent | 5 | 5 | 5 |
|  |  | Releasing agent | 0.5 | 0.5 | 0.5 |
|  |  | Primary antioxidant | 5 | 5 | 5 |
|  |  | Secondary antioxidant | 0.5 | 0.5 | 0.5 |
| Evaluation result | Pelletization |  | Possible | Possible | Possible |
|  | MFR |  | 70.1 | 51.1 | 36.3 |
|  | Formability | Time (s) | 10 | 10 | 10 |
|  |  | Burr formation | None | None | None |
|  | Reflectivity | Initial stage* | 94.0 | 94.0 | 93.9 |
|  |  | 200° C. for 35 hours | 64.8 | 69.8 | 74.6 |

As clearly seen from the results of the above Examples, when an olefin resin, a predetermined crosslinking agent, and a white pigment are included and the amount of the white pigment is more than 200 parts by mass to 500 parts by mass or less with respect to 100 parts by mass of olefin resin, a resin composition capable of having excellent formability and exhibiting excellent heat resistance even when the resin composition was formed into a molded article on the assumption that a reflector could be obtained.

As described above, the resin composition of the present invention is useful for a reflector, and a reflecting material for semiconductor light-emitting devices.

REFERENCE SIGNS LIST

10 . . . Optical semiconductor element
12 . . . Reflector
14 . . . Substrate
15 . . . Insulation portion
16 . . . Lead wire
18 . . . Lens

The invention claimed is:

1. An electron beam curable resin composition comprising:
an olefin resin;
a crosslinking agent; and
a white pigment,
wherein the crosslinking agent has a saturated or unsaturated ring structure,
at least one atom among atoms forming at least one ring is bonded to any allylic substituent of an allyl group, a methallyl group, an allyl group through a linking group, and a methallyl group through a linking group, and
the white pigment is contained in an amount of more than 220 parts by mass and 500 parts by mass or less with respect to 100 parts by mass of olefin resin, and
the crosslinking agent is contained in an amount of more than 2 parts by mass to 40 parts by mass or less with respect to 100 parts by mass of olefin resin, and
the olefin resin is a copolymer of 4-methylpentene-1 and an α-olefin having 2 to 20 carbon atoms.

2. The electron beam curable resin composition according to claim 1,
wherein at least two atoms among the atoms forming one ring of the crosslinking agent are each independently bonded to the allylic substituent.

3. The electron beam curable resin composition according to claim 2,
wherein the ring of the crosslinking agent is a six-membered ring,
at least two atoms among the atoms forming the ring are each independently bonded to the allylic substituent, and
another allylic substituent is bonded to an atom in a meta position with respect to an atom bonded with one allylic substituent.

4. The electron beam curable resin composition according to claim 1,
wherein the crosslinking agent is expressed by the following Formula (1):

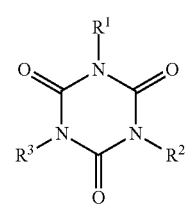

where $R^1$ to $R^3$ are each independently any allylic substituent of an allyl group, a methallyl group, an allyl group through ester bonding, and a methallyl group through ester bonding.

5. The electron beam curable resin composition according to claim 1, further comprising:
inorganic particles other than the white pigment.

6. The electron beam curable resin composition according to claim 5,
wherein the inorganic particles other than the white pigment are at least one of silica particles and glass fibers.

7. The electron beam curable resin composition according to claim 1,
wherein a dispersant or a resin modifier is blended.

8. A reflector resin frame comprising:
a cured product of the electron beam curable resin composition according to claim 1.

9. The reflector resin frame according to claim 8,
wherein a thickness is 0.1 mm to 3.0 mm.

10. A reflector comprising:
a cured product of the electron beam curable resin composition according to claim 1.

11. The electron beam curable resin composition according to claim 1,
wherein an average particle size of the white pigment is 0.10 μm to 0.50 μm.

12. The electron beam curable resin composition according to claim 1,
wherein the olefin resin is polymethylpentene.

13. The electron beam curable resin composition according to claim 1,
wherein a Reflectivity of an Initial stage of a cured product obtained by curing the electron beam curable resin composition is more than 91.6% or more at a wavelength of 450 nm.

14. An electron beam curable resin composition comprising:
an olefin resin;
a crosslinking agent; and
a white pigment,
wherein the crosslinking agent has a saturated or unsaturated ring structure,
at least one atom among atoms forming at least one ring is bonded to any allylic substituent of an allyl group, a methallyl group, an allyl group through a linking group, and a methallyl group through a linking group, and
the white pigment is contained in an amount of more than 220 parts by mass and 500 parts by mass or less with respect to 100 parts by mass of olefin resin, and the olefin resin is a copolymer of 4-methylpentene-1 and an α-olefin having 2 to 20 carbon atoms, and
the crosslinking agent is contained in an amount of more than 2 parts by mass to 40 parts by mass or less with respect to 100 parts by mass of olefin resin,
wherein the crosslinking agent is expressed by the following Formula (2):

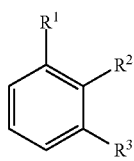 (2)

where R¹ to R³ are each independently any allylic substituent of an allyl group, a methallyl group, an allyl group through ester bonding, and a methallyl group through ester bonding.

15. The electron beam curable resin composition according to claim 14,
wherein a Reflectivity of an Initial stage of a cured product obtained by curing the electron beam curable resin composition is 91.6% or more at a wavelength of 450 nm.

16. A semiconductor light-emitting device comprising:
an optical semiconductor element; and
a reflector which is provided in the vicinity of the optical semiconductor element and reflects light from the optical semiconductor element in a predetermined direction,
wherein the optical semiconductor element and the reflector are provided on a substrate, and
at least a part of the light reflecting surface of the reflector is made of a cured product of an electron beam curable resin composition,
wherein the electron beam curable resin composition comprises:
an olefin resin;
a crosslinking agent; and
a white pigment,
wherein the crosslinking agent has a saturated or unsaturated ring structure,
at least one atom among atoms forming at least one ring is bonded to any allylic substituent of an allyl group, a methallyl group, an allyl group through a linking group, and a methallyl group through a linking group, and
the white pigment is contained in an amount of more than 220 parts by mass and 500 parts by mass or less with respect to 100 parts by mass of olefin resin, and the olefin resin is a copolymer of 4-methylpentene-1 and an α-olefin having 2 to 20 carbon atoms, and
the crosslinking agent is contained in an amount of more than 2 parts by mass to 40 parts by mass or less with respect to 100 parts by mass of olefin resin.

17. The semiconductor light-emitting device according to claim 16,
wherein a Reflectivity of an Initial stage of a cured product obtained by curing the electron beam curable resin composition is 91.6% or more at a wavelength of 450 nm.

18. A molded article production method comprising:
an injection molding process of performing injection molding on the electron beam curable resin composition at an injection temperature of 200° C. to 400° C. and at a mold temperature of 20° C. to 150° C.; and
an electron beam irradiation process of performing electron beam irradiation treatment before and after the injection molding process,
wherein the electron beam curable resin composition comprising:
an olefin resin;
a crosslinking agent; and
a white pigment,
wherein the crosslinking agent has a saturated or unsaturated ring structure,
at least one atom among atoms forming at least one ring is bonded to any allylic substituent of an allyl group, a methallyl group, an allyl group through a linking group, and a methallyl group through a linking group, and
the white pigment is contained in an amount of more than 220 parts by mass and 500 parts by mass or less with respect to 100 parts by mass of olefin resin, and the olefin resin is a copolymer of 4-methylpentene-1 and an α-olefin having 2 to 20 carbon atoms, and
the crosslinking agent is contained in an amount of more than 2 parts by mass to 40 parts by mass or less with respect to 100 parts by mass of olefin resin.

19. The molded article production method according to claim 18,
wherein a Reflectivity of an Initial stage of a cured product obtained by curing the electron beam curable resin composition is 91.6% or more at a wavelength of 450 nm.

* * * * *